United States Patent
Hoser et al.

(10) Patent No.: US 11,289,881 B2
(45) Date of Patent: Mar. 29, 2022

(54) OXIDE APERTURE SHAPING IN VERTICAL CAVITY SURFACE-EMITTING LASER

(71) Applicant: II-VI Delaware, Inc., Wilmington, DE (US)

(72) Inventors: Mirko Hoser, Zurich (CH); Abram Jakubowicz, Pfaeffikon (CH); Tomi Leinonen, Zurich (CH)

(73) Assignee: II-VI Delaware, Inc., Wilmington, DE (US)

( * ) Notice: Subject to any disclaimer, the term of this patent is extended or adjusted under 35 U.S.C. 154(b) by 58 days.

(21) Appl. No.: 16/406,140

(22) Filed: May 8, 2019

(65) Prior Publication Data

US 2020/0358252 A1    Nov. 12, 2020

(51) Int. Cl.
| | | |
|---|---|---|
| *H01S 5/183* | (2006.01) | |
| *H01S 5/30* | (2006.01) | |
| *H01S 5/20* | (2006.01) | |

(52) U.S. Cl.
CPC ........ *H01S 5/18327* (2013.01); *H01S 5/1835* (2013.01); *H01S 5/18311* (2013.01); *H01S 5/18313* (2013.01); *H01S 5/18347* (2013.01); *H01S 5/18361* (2013.01); *H01S 5/2081* (2013.01); *H01S 5/3013* (2013.01)

(58) Field of Classification Search
CPC .. H01S 5/183; H01S 5/18308; H01S 5/18311; H01S 5/18313; H01S 5/18338; H01S 5/18344; H01S 5/1835; H01S 5/18–187; H01S 5/2081; H01L 33/005–0095; H01L 33/10–105
See application file for complete search history.

(56) References Cited

U.S. PATENT DOCUMENTS

| | | | |
|---|---|---|---|
| 5,724,374 | A | 3/1998 | Jewell |
| 5,915,165 | A | 6/1999 | Sun et al. |
| 5,978,408 | A | 11/1999 | Thornton |
| 7,160,749 | B2 | 1/2007 | Chua et al. |
| 7,489,717 | B2 | 2/2009 | Baba et al. |
| 7,785,911 | B2 | 8/2010 | Kwak et al. |

(Continued)

FOREIGN PATENT DOCUMENTS

WO    WO2005006509    1/2005

OTHER PUBLICATIONS

Duality & Reliability, "Reliability of Various Size Oxide Aperture VCSEL's", First published in Proceedings of 52nd ECTC, Finisar Advanced Optical Components Division.

(Continued)

*Primary Examiner* — Minsun O Harvey
*Assistant Examiner* — Delma R Fordé
(74) *Attorney, Agent, or Firm* — Wendy W. Koba

(57) ABSTRACT

A corrected mesa structure for a VCSEL device is particularly configured to compensate for variations in the shape of the created oxide aperture that result from anisotropic oxidation. In particular, a corrected mesa shape is derived by determining the shape of an as-created aperture formed by oxidizing a circular mesa structure, and then ascertaining the compensation required to convert the as-created shape into a desired ("target") shaped aperture opening. The compensation value is then used to modify the shape of the mesa itself such that a following anisotropic oxidation yields a target-shaped oxide aperture.

4 Claims, 4 Drawing Sheets

(56) References Cited

U.S. PATENT DOCUMENTS

| | | |
|---|---|---|
| 8,355,423 B2 | 1/2013 | Moser et al. |
| 8,530,358 B2 | 9/2013 | Chen et al. |
| 9,735,545 B1 | 8/2017 | Chen et al. |
| 9,859,685 B2 | 1/2018 | Leobandung et al. |
| 2003/0007531 A1 | 1/2003 | Aggerstam |
| 2006/0187991 A1 | 8/2006 | Thornton |
| 2007/0091959 A1 | 4/2007 | Royo |
| 2007/0091965 A1* | 4/2007 | Tanabe ............... H01S 5/1835 372/50.124 |
| 2011/0176572 A1* | 7/2011 | Moser ............... H01S 5/18338 372/46.01 |
| 2011/0182314 A1* | 7/2011 | Yoshikawa ......... H01S 5/18338 372/46.012 |
| 2012/0235191 A1 | 9/2012 | Ishida et al. |

OTHER PUBLICATIONS

Demeulenaere, B. et al., "Detailed Study of AlAs-Oxidized Apertures in VCSEL Cavities for Optimized Modal Performance", IEEE Journal of Quantum Electronics, vol. 35, No. 3, Mar. 1999.

* cited by examiner $|vx| = |vy|$ $|vx| \neq |vy|$

OXIDE APERTURE SHAPING IN VERTICAL CAVITY SURFACE-EMITTING LASER

TECHNICAL FIELD

The present invention relates to vertical cavity surface-emitting lasers (VCSELs) and, more particularly, to a technique for shaping the oxide aperture within the mesa structure to provide control of the emitted beam profile.

BACKGROUND OF THE INVENTION

In the fabrication of VCSELs that utilize an oxide aperture to provide current confinement, the aperture is typically created by oxidizing the exposed mesa structure of a distributed Bragg reflector (DBR) portion of the VCSEL. A selected layer within the mesa is formed a priori to exhibit a higher concentration of a material that is quickly oxidized with respect to the remaining layers in the structure. In a GaAs-based VCSEL device, an aperture layer of $Al_xGa_{1-x}As$ may be purposely formed to exhibit an aluminum content x of 0.9 or more (for example), since aluminum is known to have a high oxidation rate. Commonly, the lateral oxidation progresses inwardly from the exposed mesa sidewalls and therefore results in creating a central aperture shape that mimics the topology of the mesa itself. The oxidation rate depends on factors such as the material composition of the $Al_xGa_{1-x}As$ layer, layer thickness, oxidation temperature, and the like.

In some cases, the oxidation process will be isotropic; that is, the oxidation rate is essentially the same along both the x-direction and y-direction of the planar surface of the aperture layer. As a result, the lateral progression of the oxidation across the x-y plane faithfully replicates the x-y plane topology of the mesa structure itself, with an isotropic oxidation of a circular mesa structure creating an oxide aperture with a circular shape.

There are many instances, however, where certain fabrication processes and materials result in the situation where the oxidation rates may differ for different directions across the x-y plane of the aperture layer, commonly referred to as direction-dependent, or "anisotropic" oxidation. In an exemplary anisotropic oxidation process, for example, the oxidation progresses at a first rate along the x-direction of aperture layer 22 and a second rate along the y-direction of the same layer. Differences in the oxidation conditions, oxidizing agent concentration, etc., may also result in creating a noticeable difference in oxidation rates along the x- and y-directions.

Inasmuch as a VCSEL is typically preferred to have a circular aperture created within the oxidized aperture layer, the mesa itself is formed (etched) to exhibit a circular cross-sectional shape. The use of a circular mesa is based on the presumption of the oxidation will be a direction-independent, isotropic process and create the circular-shaped oxide aperture. However, the actual differentiation in oxidation rates associated with anisotropic oxidation results in the formation of a non-circular oxide aperture from a circular mesa, which ultimately leads to the generation of a non-circular output beam.

SUMMARY OF THE INVENTION

The present invention relates to the use of a corrected mesa structure that is particularly configured to compensate for variations in the shape of an oxide aperture associated with anisotropic oxidation. In particular, a corrected mesa shape is derived by determining the shape of an as-created aperture formed by oxidizing a conventional mesa structure, and then determining the compensation required to convert the as-fabricated aperture shape into a desired shape (i.e., "target" shape). The determined compensation is then used to modify the structure of the mesa itself to exhibit a geometry (that is, a particular cross-sectional shape) that will create a target-shaped aperture in the presence of anisotropic oxidation of the aperture layer. While in many cases the target shape will be circular, the principles of the present invention are not so limited, and provide method of forming an oxide aperture of any desired target shape from an initial mesa of any given geometry.

An exemplary embodiment of the present invention takes the form of a method of creating an oxide aperture of a predetermined target cross-sectional shape within a mesa structure of a vertical cavity surface emitter laser (VCSEL) device. The exemplary method includes the steps of: a) defining a target oxide aperture shape $r_{oxap}(\theta)$; b) performing oxidation of a VCSEL mesa structure having an initial mesa shape $r_{mesa}(\theta)$; c) determining a shape $d_{oxap}(\theta)$ of an as-fabricated oxide aperture resulting from the oxidation of step b); d) measuring a difference between the target oxide aperture shape $r_{oxap}(\theta)$ and the as-fabricated shape $d_{oxap}(\theta)$ at various radial locations to create a radial deviation function $\Delta(\theta)$; e) adding the deviation function $\Delta(\theta)$ to the initial mesa shape $r_{mesa}(\theta)$ to define a corrected mesa shape $c_{mesa}(\theta)$; and f) etching the mesa of the VCSEL to exhibit the corrected mesa shape.

Another embodiment of the present invention takes the form of a VCSEL formed to include a specially-shaped mesa structure. The VCSEL includes a substrate, on which are disposed first and second distributed Bragg reflectors (DBRs). Each DBR is formed of a stack of layers of alternating refractive index and, in accordance with this embodiment of the present invention, the second DBR is processed to exhibit a corrected mesa structure of a predetermined shape. This predetermined shape is defined a priori as that which is required to create an oxide aperture of a targeted shape. The VCSEL also includes an active layer disposed between the DBRs and an aperture layer disposed within the mesa structure. The aperture layer is formed of a composition that exhibits anisotropic oxidation and includes an outer insulating boundary region coincident with sidewalls of the corrected mesa structure and an inner oxide aperture of a target shape, the target shape defined by anisotropic oxidation of the aperture layer.

Yet another embodiment of the present invention relates to a method of manufacturing a vertical cavity surface emitting laser (VCSEL). In this embodiment, the method includes growing on a substrate layers to form a first distributed Bragg reflector (DBR) and a second DBR, each of the first and second DBRs comprising a stack of layers of alternating refractive index, an active layer disposed between the first DBR and the second DBR, and an aperture layer disposed either between the first and second DBRs or within one of the DBRs. The aperture layer is formed of a composition that exhibits anisotropic oxidation and the method also includes etching the layers to provide a mesa having a corrected shape determined for formation of an oxide aperture of a predetermined target shape and oxidizing the aperture layer within the mesa so as to produce an outer boundary coincident with the periphery of the corrected mesa shape and an internal boundary defining the predetermined target shape of the oxide aperture.

Other and further embodiments and aspects of the present invention will become apparent during the course of the following discussion and by reference to the accompanying drawings.

BRIEF DESCRIPTION OF THE DRAWINGS

Referring now to the drawings, where like numerals represent like parts in several views.

DETAILED DESCRIPTION

Figure 1:
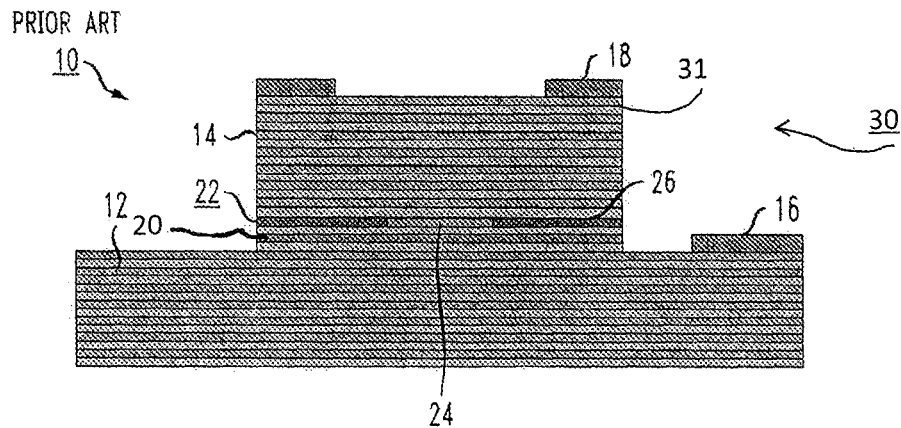
FIG. 1 is a simplified cross-sectional view of an exemplary VCSEL structure.

Vertical cavity surface-emitting lasers (VCSELs) consist of a pair of distributed Bragg reflectors (DBRs) that function as the opposing mirror surfaces of a laser cavity, with the laser's active region and current-confining structure positioned between the pair of DBRs. FIG. 1 is a simplified cut-away view of a typical VCSEL 10, illustrating a first DBR 12 (grown on a suitable substrate material) and a second (opposing) DBR 14. As shown, second DBR 14 is formed to exhibit a mesa structure, allowing for top-side electrical contacts to be made to both first DBR 12 (in the form of a deposited first contact 16) and second DBR 14 (here, a deposited second contact 18). An active region 20 is formed between first DBR 12 and second DBR 14, with a current-confining aperture layer 22 including a central opening 24 (hereinafter referred to as "oxide aperture 24") formed above active region 20. As is known in the art, oxide aperture 24 is used to confine the electrical current and propagating optical modes to the center of the structure, with the light beam created by VCSEL 10 exiting through the top surface, out of second DBR 14.

Oxide aperture 24 is substantially optically transparent having a first refractive index resulting in a first optical path length. The remainder of layer 22 surrounding aperture 24, defined as outer insulating boundary 26, has a different, second refractive index and, therefore, a different, second optical path length. Consequently, light transmitted through outer insulating boundary 26 is out of phase with parallel light transmitted through oxide aperture 24. Thus, layer 22 functions as an optical spatial filter, since transverse modes that optically overlap with the layer experience preferentially increased optical losses.

Following epitaxial growth of the required semiconductor layers upon the substrate, a mesa structure 30 is defined by means of a lithographic process followed by an etching step. A conventional mesa 30 has a generally circular shape, being either generally cylindrical or generally conic. Subsequent to the mesa etch step, an oxidation process is performed to create oxide aperture 24. As mentioned above, aperture layer 22 comprises a semiconductor material having an increased proportion of a selected material (typically, aluminum for a layer of AlGaAs) relative to the remainder of the layers within the mesa, where the higher concentration of the selected material provides a higher oxidation rate of aperture layer 22 with respect to the remainder of the semiconductor layers forming mesa 30. In an exemplary embodiment, an "aluminum-rich" layer 22 of $Al_xGa_{1-x}As$ may exhibit an aluminum content x of 90% or more.

In particular, aperture layer 22 is oxidized laterally from the edges toward the center of the mesa structure. The other layers in the mesa structure remain essentially unoxidized (or are significantly less oxidized) since they are not formed a priori to have a higher content of a material such as aluminum. The oxidized portions of layer 22 become electrically non-conductive, defining outer insulating boundary 26. As briefly mentioned above, the size and shape of aperture 24 formed within the central region of aperture layer 22 is a function of the oxidation rate of the material forming the layer, which is dependent upon the oxidation chemistry, the aluminum concentration, the time lapse of the oxidation process and other factors. The oxidation may be either isotropic or anisotropic, as described above.

Figure 2:
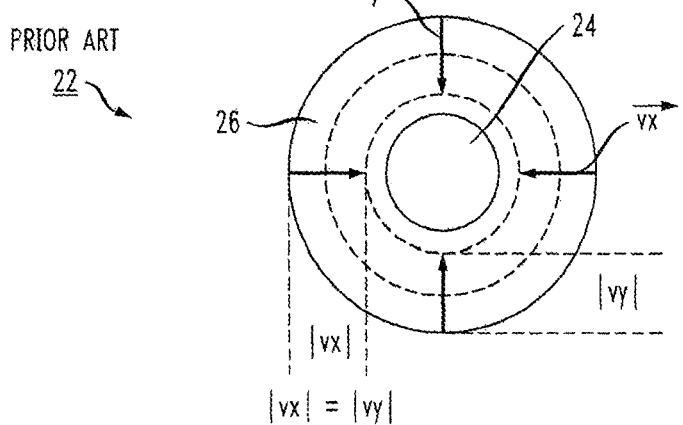
FIG. 2 is a top view of an aperture layer within the mesa portion of a VCSEL structure, illustrating the formation of a circular oxide aperture during an isotropic oxidation process.

FIG. 2 is a top view diagram of aperture layer 22, illustrating the results of an isotropic oxidation process in the manner described above. This view in FIG. 2 depicts the oxidation rates along the x-axis and y-axis directions in vector form ($\vec{VX}$ and $\vec{VY}$), pointing to the center of the structure from the outer edges. In this example of isotropic oxidation, the vectors have same length ($|VX|=|VY|$), since the oxidation rate is independent of direction. FIG. 2 also illustrates the progression of the oxidation front during the oxidation of layer 22, proceeding inward from an outer periphery 22-O at the vertical edge 31 of mesa 30 (as shown in FIG. 1). The particulars of the process chemistry and material compositions determine the time duration required to form an oxide aperture 24 of a desired diameter D. Inasmuch as the starting shape of mesa 30 is circular, and the oxidation process is isotropic (i.e., $\vec{VX}=\vec{VY}$), the final shape of aperture 24 will be circular as well.

Figure 3:
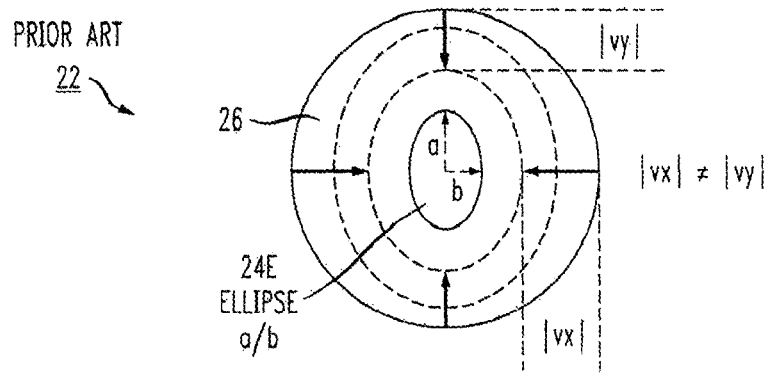
FIG. 3 is a top view of an aperture layer within the mesa portion of the VCSEL structure, illustrating in this particular example the formation of an elliptical oxide aperture during an anisotropic oxidation process.

The same desired result of a circular oxide aperture is not the case when the oxidation process is anisotropic (i.e., $\vec{VX} \neq \vec{VY}$). FIG. 3 illustrates the results of an exemplary anisotropic oxidation process. In this case, the vectors illustrated in the embodiment of FIG. 3 indicate a situation when the oxidation rate along the x-axis direction is higher than the oxidation rate in the y-axis direction. Inasmuch as the starting material is a circular layer (as part of the circular mesa structure), the end result is an elliptically-shaped aperture, denoted 24E in FIG. 3. In most applications, it is preferred for a VCSEL to exhibit a circular beam profile; therefore, deviations in the oxide aperture from this form are problematic.

Figure 4:
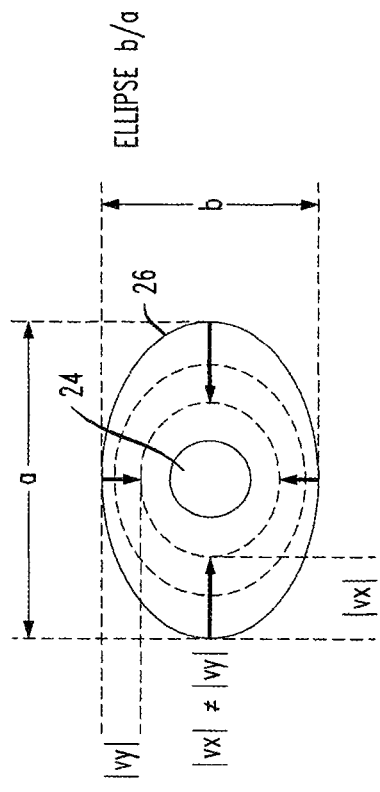
FIG. 4 is a top view of a corrected-shape aperture layer with a corrected-shape mesa portion of the VCSEL structure, illustrating in this case the formation of a circular oxide aperture from an elliptically-shaped aperture layer under the same oxidation conditions as used in the formation of the structure of FIG. 3.

The techniques of the present invention address this problem by shaping the mesa to compensate for differences attributed to anisotropic oxidation rates. FIG. 4 is a diagram illustrating the inventive principle at a high level, in this case correcting for the non-circular oxide aperture 24E shown in FIG. 3.

Figure 5:
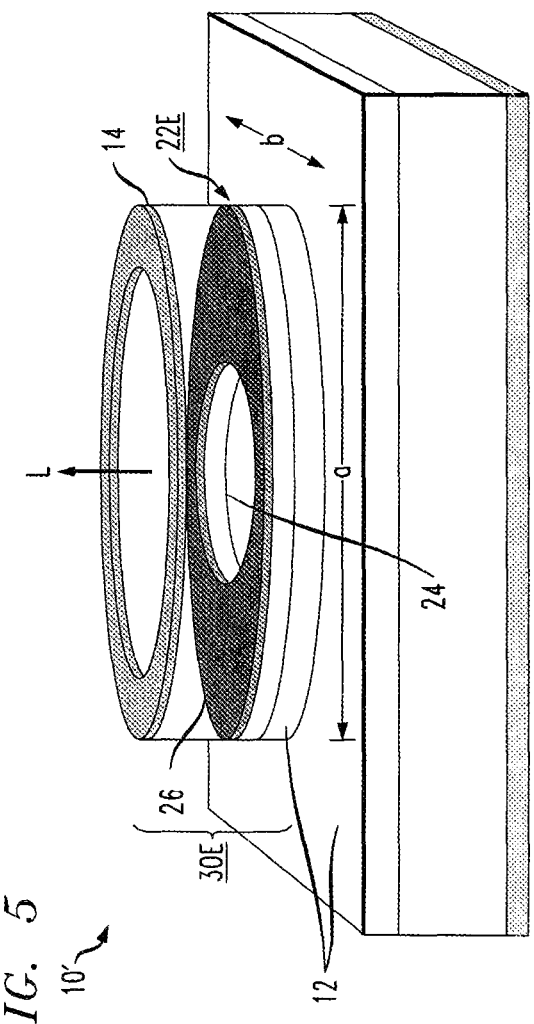
FIG. 5 is an isometric view of a VCSEL exhibit a corrected-shape mesa useful in forming a preferred (target)-shaped oxide aperture in accordance with the teachings of the present invention.

In accordance with the principles of the present invention and with reference to FIGS. 4 and 5, a mesa 30E is patterned and etched (as shown in FIG. 5) to exhibit an elliptical shape with a ratio of major/minor axes that is essentially the same as elliptical oxide aperture 24E shown in FIG. 3. Aperture layer 22E, as part of mesa 30E, exhibits the same elliptical shape as shown in FIG. 4. In the formation of elliptical mesa 30E, the orientation of the major and minor axes is reversed from that of elliptical aperture 24E, as best shown by comparing FIG. 5 to FIG. 3. That is, the major axis of elliptical mesa 30E (and, similarly, the major axis of aperture layer 22E) is aligned with the axis along which the oxide rate is faster (here, the x-axis direction). The minor axis of mesa 30E/aperture layer 22E is therefore aligned with the axis associated with the slower rate of oxidation. For example, presuming the x-direction oxidation rate is twice that of the y-direction oxidation rate, elliptical mesa 30E will be shaped and oriented such that the width of aperture layer 22E in the x-direction is twice that of layer 22E in the y-direction. The balancing of the length of oxidized material with the oxidation rate thus results in forming a circular aperture 24, as shown in FIG. 4. FIG. 5 is an isometric view of an exemplary VCSEL 10' with a corrected mesa 30E, showing both the elliptical form of aperture layer 22E and the circular form of oxide aperture 24.

Figure 6:
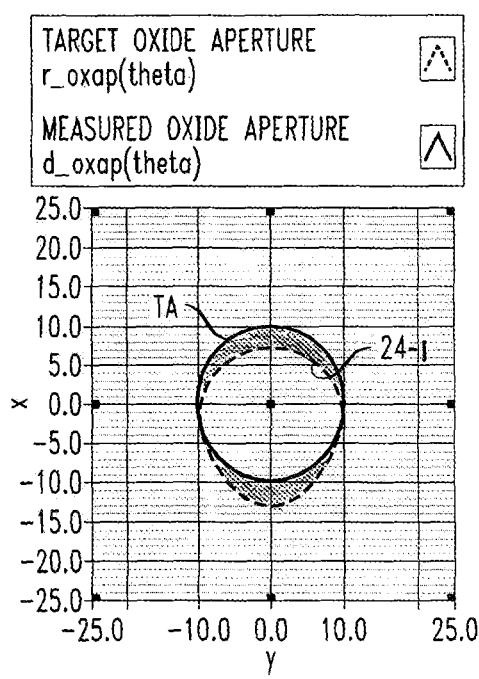
FIG. 6 is a graph showing the difference in cross-sectional shape between an as-fabricated oxide aperture (from anisotropic oxidation) and a target-shaped oxide aperture.

In more detail, and with reference to FIGS. 6-9, an exemplary process to compensate for anisotropic oxidation in accordance with the principles of the present invention utilizes in the following steps. Starting with a VCSEL structure having a conventional circular mesa, a conventional oxidation process is performed and an oxide aperture is created. FIG. 6 is a plot showing the topology of an as-fabricated oxide aperture 24-1, with an area defined as $d_{oxap}(\theta)$. Also plotted in FIG. 6 is a circular form of a "target" aperture TA, defined by the relation $r_{oxap}(\theta)$.

Figure 7:
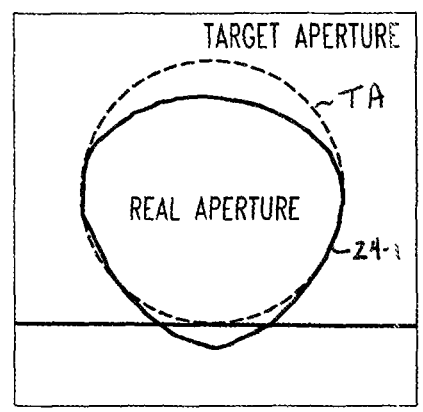
FIG. 7 is an SEM image showing the same cross-sectional shapes as depicted in FIG. 6.

FIG. 7 is a photograph of an actual oxidation aperture (denoted as "real aperture") that resulted from an anisotropic oxidation process. A diagram of target aperture TA is included as an overlay on the photograph. The somewhat triangularly deformed shape of oxide aperture 24-1 is evident in comparison to the circular form of target aperture TA.

Figure 8:
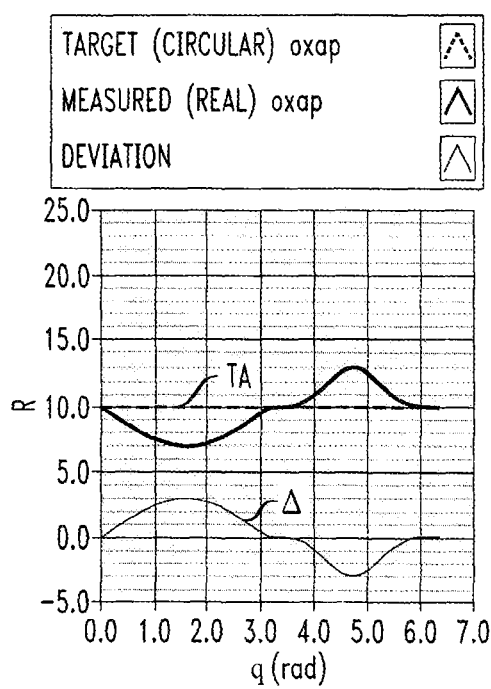
FIG. 8 is a plot, in radians, of the difference between the outer periphery of the as-fabricated oxide aperture and the target oxide aperture.

A point-by point deviation between the actual and target shapes, shown as shaded regions in FIG. 6, is measured as a function of radial position. FIG. 8 is a plot, in radians, showing this difference between as-fabricated aperture 24-1 and target aperture TA, defined as a deviation function $\Delta(\theta)$. In accordance with the principles of the present invention, the deviation function $\Delta(\theta)$ is then used as the correction factor needed to re-shape the conventional circular mesa into a geometry that will form a circular oxide aperture during an anisotropic oxidation process. The deviation is applied to the relationship defining the shape of the original mesa to create a "corrected" mesa shape. For example, in the case of a conventional circular mesa (defined by the relation $r_{mesa}(\theta)$), the definition of the "corrected" shape is found by adding the deviation function to the defined relation, arriving at a mathematical definition of a compensated ("corrected") mesa shape:

$$c_{mesa}(\theta) = r_{mesa}(\theta) + \Delta(\theta).$$

Figure 9:
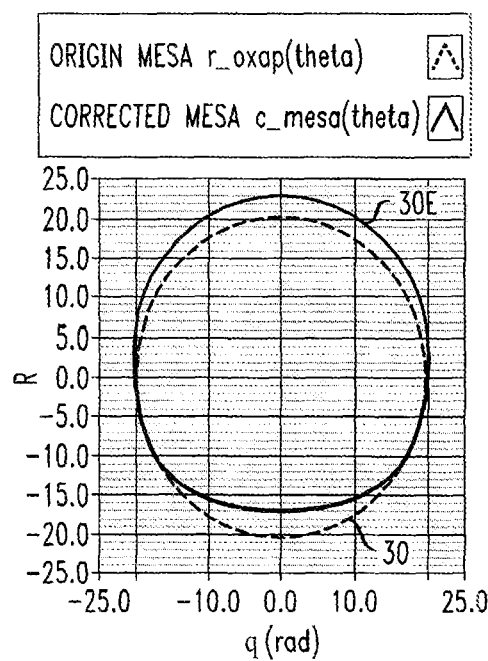
FIG. 9 is a graph showing an "original" mesa shape (here, circular) and a corrected mesa shape, formed using the data of FIG. 8, to thereafter fabricate an oxide aperture of the target shape during anisotropic oxidation.

FIG. 9 is a plot showing the results of this anisotropic oxidation compensation as applied to the shape of the mesa. The original circular mesa is shown as 30 in FIG. 9 and the corrected mesa shape is shown 30E.

Therefore, in accordance with the principles of the present invention, by etching the VCSEL structure to form a mesa following the mathematical shape defined by $c_{mesa}(\theta)$, the subsequent anisotropic oxidation of the oxide aperture layer will result in the creation of a circular aperture defined by $r_{oxap}(\theta)$.

Figure 10:
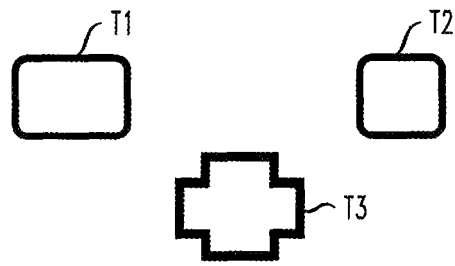
FIG. 10 shows possible alternative cross-sectional shapes for the target oxide aperture.

It is to be understood that while the process of the present invention as outlined above is used to form a circular aperture as the "target" shape, the principles of the present invention can be similarly applied to determine the deviation between an as-fabricated aperture and any desired target shape (e.g., rectangular, multi-sectored, or the like). FIG. 10 illustrates selected "target" shapes of an oxide aperture that may be created by modifying the shape of an original mesa structure in accordance with the principles of the present invention as discussed above. In particular, FIG. 10 shows possible target shapes as: rectangular (T1), square (T2), and "cross" (T3). More involved two-dimensional geometries are possible.

Figure 11:
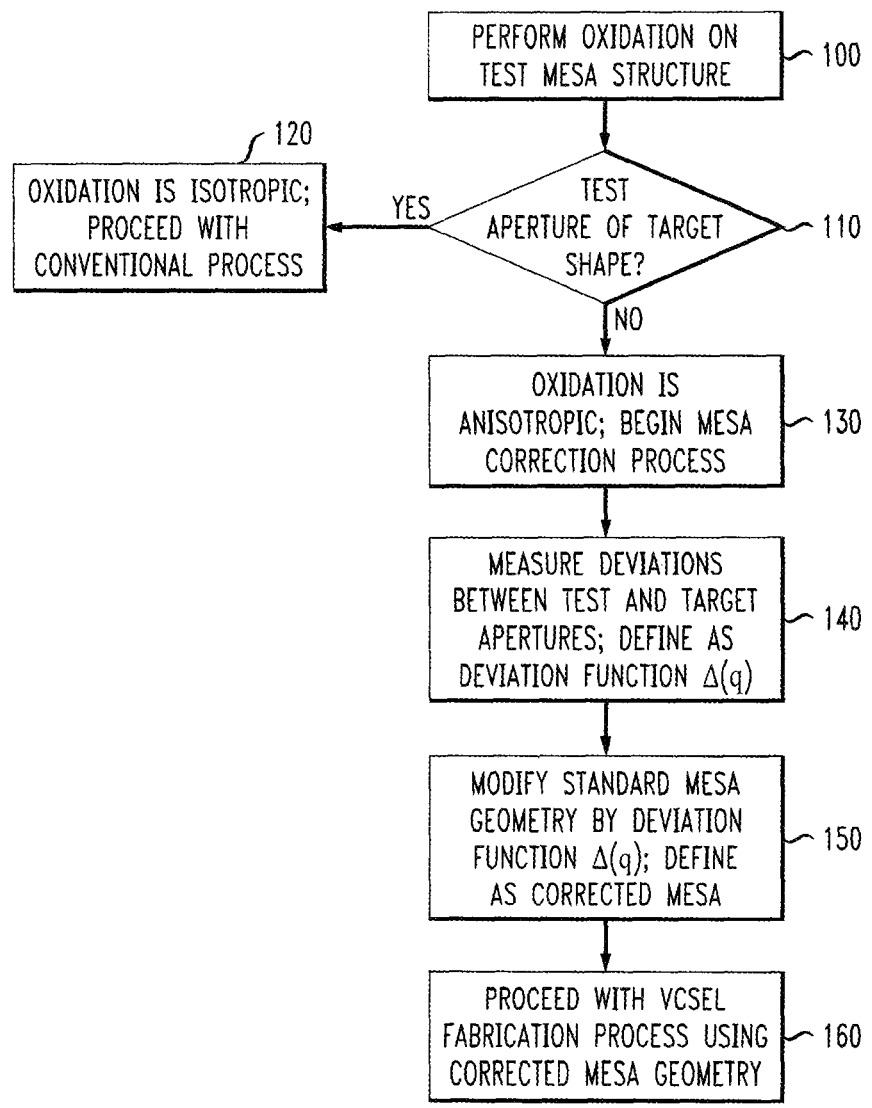
FIG. 11 is a flowchart of an exemplary set of steps used in determining the correction to be applied to a mesa structure to result in forming an oxide aperture of a desired target shape in the presence of anisotropic oxidation.

FIG. 11 is a flowchart illustrating an exemplary set of process steps that may be used to form a circular oxide aperture in the presence of an anisotropic oxidation process in accordance with the principles of the present invention. As shown, an initial set of steps is performed on a "test" structure, which may comprise only a portion of the complete VCSEL device as shown in FIG. 1. That is, for the purposes of the present invention, the test structure may comprise a VCSEL structure fabricated up through the step of etching the mesa into the second DBR. Thus, first step 100 shown in FIG. 11 specifies the use of a "test mesa structure". However, it is to be understood that a complete VCSEL device may be similarly analyzed to ascertain its as-fabricated oxide aperture geometry.

Continuing with the description of the FIG. 11 flowchart, the first step (step 100) is shown as performing a conventional oxidation process on the test mesa structure. The test mesa structure is formed to including current-confining layer 22 of a predetermined aluminum (for example) concentration. Once the oxidation has progressed for a predetermined period of time, the shape of oxide aperture 24 created in layer 22 is examined (step 110). If the shape of the as-fabricated oxide aperture is essentially the same as the target aperture, it may be presumed that the oxidation process is isotropic, and the remainder of the VCSEL fabrication process may proceed as normal (step 120).

Presuming that the result from the evaluation of step 110 is that the test aperture does not match the target aperture, the conclusion may be reached that the oxidation process experienced by the test structure was an anisotropic oxidation, and the correction process of the present invention is needed to create an oxide aperture of the target shape (shown as step 130). By knowing the specific relation (equation) defining the target shape, the differences between the test (as-fabricated) oxide aperture and target aperture are measured at a set of points around the perimeter of the apertures (i.e., measured in radians). As shown in step 140, this set of measured deviations is fitted (e.g., polynomial) and leads to a correction function Mc).

This correction function is subsequently utilized in step 150 to modify the conventional circular pattern used for the mesa etch step, so as to form a "corrected" mesa structure that compensates for the specific deviations in the anisotropic oxidation results found in the test structure. In particular, this correction is applied to the mask used in the process of preferentially etching the semiconductor layers to create the mesa structure (shown as step 160) thereafter used in the formation of wafer scale numbers of VCSEL devices.

While the invention has been described in conjunction with specific embodiments, it is evident to those skilled in the art that many alternatives, modifications, and variations will be apparent in light of the foregoing description. Accordingly, the invention is intended to embrace all such alternatives, modifications and variations that fall within the spirit and scope of the appended claims.

What is claimed is:

1. A method of creating an oxide aperture of a predetermined target cross-sectional shape within a mesa structure of a vertical cavity surface emitter laser (VCSEL) device, the method including the steps of:

a) defining a target oxide aperture shape $r_{oxap}(\theta)$;
   b) performing oxidation of a test VCSEL mesa structure having an initial mesa shape $r_{mesa}(\theta)$;
   c) determining a shape $d_{oxap}(\theta)$ of an as-fabricated oxide aperture resulting from the oxidation of step b);
   d) measuring a difference between the target oxide aperture shape $r_{oxap}(\theta)$ and the as-fabricated shape $d_{oxap}(\theta)$ at various radial locations to create a radial deviation function $\Delta(\theta)$; and
   e) adding the deviation function $\Delta(\theta)$ to the initial mesa shape $r_{mesa}(\theta)$ to define a corrected mesa shape $c_{mesa}(\theta)$; and
   f) etching the VCSEL device to exhibit the corrected mesa shape.

2. The method as defined in claim 1, further comprising the step of:
   oxidizing the corrected mesa shape structure to form the oxide aperture of the predetermined target cross-sectional shape.

3. The method as defined in claim 1 wherein the target oxide aperture is circular in cross-sectional shape.

4. The method as defined in claim 1, wherein in performing step d), if the radial deviation function $\Delta(\theta)$ is less than a defined threshold value, eliminating the performance of steps e) and f).

* * * * *